US006670621B2

(12) United States Patent
Chen

(10) Patent No.: US 6,670,621 B2
(45) Date of Patent: Dec. 30, 2003

(54) CLEAN ROOM ARRANGEMENT FOR ELECTRON BEAM LITHOGRAPHY

(76) Inventor: Hsing-Yao Chen, 222 Bridle Path Ct., Fox River Grove, IL (US) 60021

( * ) Notice: Subject to any disclaimer, the term of this patent is extended or adjusted under 35 U.S.C. 154(b) by 162 days.

(21) Appl. No.: 09/911,068

(22) Filed: Jul. 23, 2001

(65) Prior Publication Data

US 2003/0015670 A1 Jan. 23, 2003

(51) Int. Cl.$^7$ .............................. A61N 5/00; G21G 5/00; G21K 5/10; H01N 37/08
(52) U.S. Cl. ................................ 250/492.2; 250/492.21
(58) Field of Search ........................ 250/492.2, 441.11, 250/453.11, 454.11, 492.3, 492.21

(56) References Cited

U.S. PATENT DOCUMENTS

| 4,831,270 A | * | 5/1989 | Weisenberger ............ 250/492.2 |
| 5,004,924 A | * | 4/1991 | Imahashi .................. 250/442.1 |
| 6,236,163 B1 | * | 5/2001 | Maishev et al. ......... 315/111.81 |

* cited by examiner

Primary Examiner—Stephen D. Meier
Assistant Examiner—Alfred E Dudding
(74) Attorney, Agent, or Firm—Emrich & Dithmar

(57) ABSTRACT

For use in the fabrication of semiconductor devices by electron beam lithography, a transport system provides relative displacement between an array of plural vacuum stations and a first ultra clean room for sequentially transporting each vacuum station through the first clean room. The first ultra clean room and vacuum stations are disposed in a second clean room having an atmosphere not as contaminant-free as the first ultra clean room. Each vacuum station includes an evacuated housing within which is disposed a combination of a semiconductor substrate, or wafer, and plural electron beam sources for forming integrated circuits on the substrate as the vacuum station is transported through the second clean room. The first ultra clean room is displaced along an aligned array of vacuum stations or the aligned array of vacuum stations are displaced through a stationary first ultra clean room to permit the electron beam formed integrated circuits to be removed from a vacuum station and be replaced by a new set of substrates.

11 Claims, 2 Drawing Sheets

CLEAN ROOM ARRANGEMENT FOR ELECTRON BEAM LITHOGRAPHY

FIELD OF THE INVENTION

This invention relates generally to the fabrication of semiconductor devices by means of electron beam lithography and is particularly directed to a clean room arrangement for use in the manufacture of semiconductor devices using electron beam lithography.

BACKGROUND OF THE INVENTION

Photolithography is commonly used in the manufacture of semiconductor devices. In this approach, the image of a reticle is reproduced by a light source such as of ultraviolet (UV) light onto a photosensitive resist-covered semiconductor substrate, or wafer. Another approach has also been adopted in the fabrication of semiconductor devices. This latter approach employs an electron beam directed onto the semiconductor substrate for tracing out the desired integrated circuit pattern. Because this electron beam lithography technique must be performed in a very carefully controlled environment, the process is carried out in an ultra clean room. The ultra clean room contains, by definition, an extremely low number of contaminant particles per unit volume. Controlling the semiconductor device manufacturing environment to the extent of essentially being contaminant-free involves complicated engineering solutions which are expensive. The cost increases with the size of the ultra clean room.

Referring to FIG. 1, there is shown a simplified illustration of a conventional arrangement for the manufacture of semiconductor devices incorporating an ultra clean room 10 as encountered in the prior art. Ultra clean room 10 is shown as being rectangular in shape, having a width "a" and a length "b". Ultra clean room 10 is defined by first, second, third and fourth walls 12a, 12b, 12c and 12d as well as a floor 12e and a ceiling which is not shown in the figure for simplicity. Disposed within the ultra clean room 10 and arranged in a spaced manner are plural vacuum stations 14a, 14b, 14c . . . 14n within which the semiconductor devices incorporating integrated circuits are formed. Ultra clean room 10 provides a sealed environment for the manufacture of semiconductor devices within the room. Ultra clean room 10 is characterized as having an environment which is essentially contaminant free. For example, a Class 1 clean room is defined as having no more than one (1) contaminant particle per cubic foot of volume. Similarly, a Class 100 clean room is characterized as having no more than one hundred (100) contaminant particles per cubic foot of volume. Various sophisticated filtering and air purifying systems are used to remove contaminants from the ultra clean room 10. The lower the class of the ultra clean room, the more extensive and expensive is the air filtering and purifying system required to remove greater numbers of contaminant particles. In addition, the larger dimensions of the clean room, the more extensive and expensive is the air filtering and purifying system required to remove the contaminant particles from the larger volume of air.

The present invention addresses the aforementioned limitations of the prior art by providing an ultra clean room arrangement for use in the fabrication of semiconductor devices by electron beam lithography which reduces the cost associated with the ultra clean room by reducing its size and complexity.

OBJECTS AND SUMMARY OF THE INVENTION

Accordingly, it is an object of the present invention to provide apparatus for electron beam lithography such as used in the manufacture of semiconductor devices.

It is another object of the present invention to provide a clean room arrangement such as is used in the fabrication of high density semiconductor integrated circuits which is of reduced cost to manufacture and operate, is adapted for large volume integrated circuit production, and affords increased flexibility in the manufacturing process.

Yet another object of the present invention is to simplify and reduce the costs of manufacturing semiconductor devices by reducing the size and complexity of the controlled environment space within which the devices are manufactured.

The present invention contemplates an arrangement for forming integrated circuits on a semiconductor substrate comprising: a first clean room characterized as containing a first reduced level of contaminants; plural vacuum stations arranged in a spaced manner in common alignment; a semiconductor substrate disposed at each vacuum station; plural electron beam sources disposed at each vacuum station and aligned with the semiconductor substrate for directing electron beams onto an associated semiconductor substrate for forming integrated circuits thereon; and a transport mechanism connected to the first clean room or to the plural vacuum stations for sequentially positioning each vacuum station in the first clean room to permit substrates having integrated circuits formed thereon when the vacuum station is not in the first clean room to be removed from the vacuum station in the first clean room and replaced by another substrate.

BRIEF DESCRIPTION OF THE DRAWINGS

The appended claims set forth those novel features which characterize the invention. However, the invention itself, as well as further objects and advantages thereof, will best be understood by reference to the following detailed description of a preferred embodiment taken in conjunction with the accompanying drawings, where like reference characters identify like elements throughout the various figures, in which:

DETAILED DESCRIPTION OF THE PREFERRED EMBODIMENTS

Figure 2:
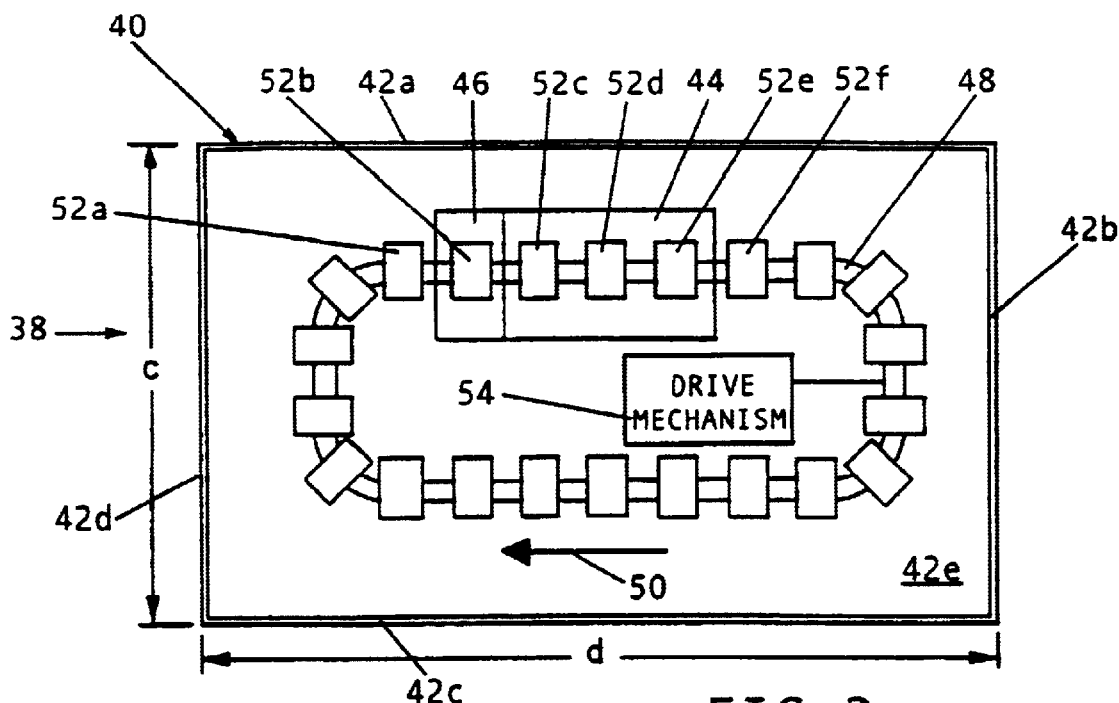
FIG. 2 is a simplified illustration of a clean room arrangement for use in electron beam lithography in the manufacture of semiconductor circuits in accordance with one embodiment of the present invention.

Referring to FIG. 2, there is shown a simplified illustration of one embodiment of a clean room arrangement 38 in accordance with the present invention which addresses the problems encountered in prior art clean room arrangements as discussed above. Clean room arrangement 38 includes an outer, larger secondary clean room 40 and an inner, smaller ultra clean room 44. Secondary clean room 40 includes first, second, third and fourth walls 42a–42d, a floor 43e, and a ceiling which is not shown in the figure for simplicity. Disposed within the secondary clean room 40 is the ultra clean room 44. The atmosphere within the ultra clean room 44 contains less contaminants than that of the secondary clean room 40. Thus, for example, the secondary clean room 40 would typically be a Class 100 or Class 1000 type of clean room having on the order of 100 or 1000 contaminant particles per cubic foot, while the ultra clean room 44 would typically be a Class 1 or Class 10 clean room having 1 or 10 contaminant particles per cubic foot of volume.

Also disposed within the secondary clean room 40 is a transport system 48. Transport system 48 may take on various forms such as that of a conveyor having a continuous moving belt. Disposed on the transport system 48 in a spaced manner are plural vacuum stations, some of which are shown as elements 52a–52f. Transport system 48 displaces the vacuum stations in the direction of arrow 50. Each of the vacuum stations is sequentially moved through the ultra clean room 44 by the displacement of the transport system 48. The ultra clean room 44 is operated under a positive pressure so as to prevent any contaminants from the secondary clean room 40 from entering the ultra clean room. At the input end of the ultra clean room 44 is an air shower arrangement 46 which directs a jet of air onto each of the vacuum stations as the vacuum station enters the ultra clean room 44. The air jet in the air shower 46 removes contaminant particles from the vacuum stations as they enter the ultra clean room 44. Transport system 48 includes a drive mechanism 54 for displacing the belt arrangement and vacuum stations disposed thereon in the direction of arrow 50. Although the transport system 48 is shown as having a belt arrangement which is generally rectangular in shape, the transport system is not limited to this shape and may assume a wide variety of shapes and configurations.

Figure 3:
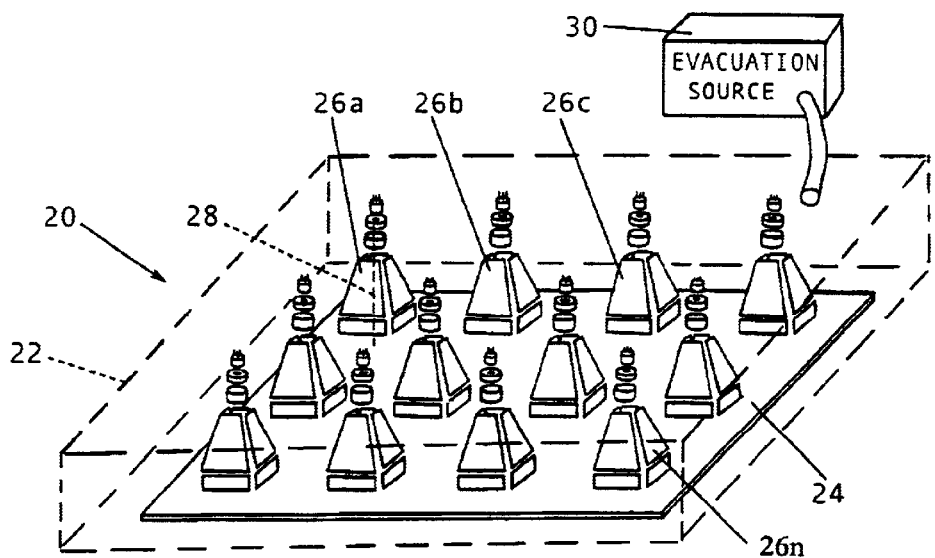
FIG. 3 is a simplified perspective view of a vacuum station used in the manufacture of semiconductor circuits by means of electron beam lithography as employed in the clean room arrangements of FIGS. 2 and 4.
Figure 1:
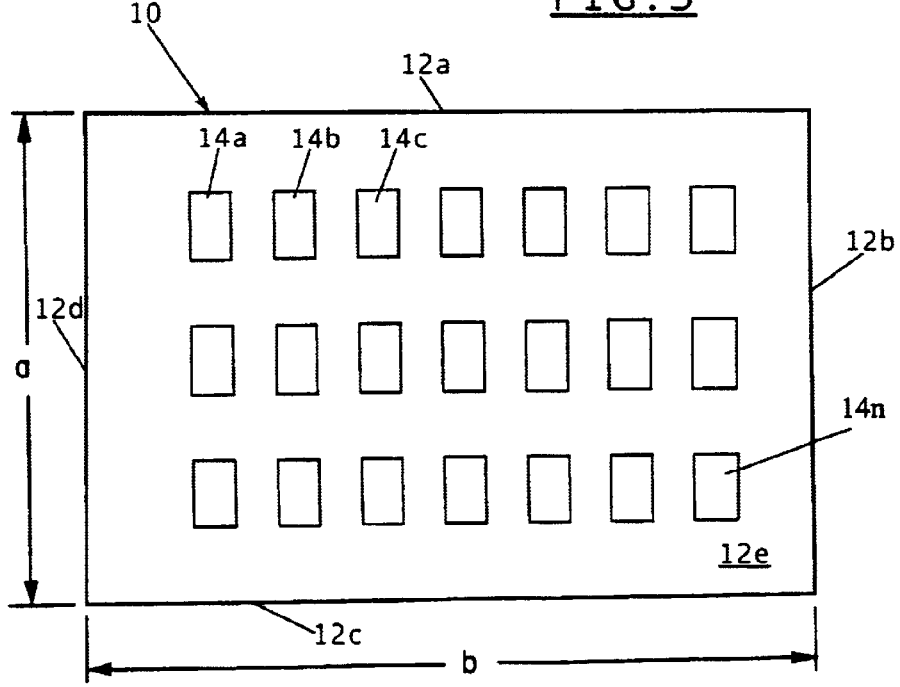
FIG. 1 is a simplified illustration of a conventional multi-station arrangement for manufacturing semiconductor conductor circuits by means of electron beam lithography in an ultra clean room as in the prior art.

Referring to FIG. 3, there is shown a simplified perspective view of a vacuum station 20 contemplated for use in the present invention. Vacuum station 20 includes a closed housing 22 (shown in dotted line form) connected to an evacuation source 30 for forming a vacuum within the housing. Evacuation source 30 may be in the form of a conventional vacuum pump. Disposed within the closed housing 22 in a space banner are plural electron beam tubes 26a, 26b, 26c . . . 26n. Each of the electron beam tubes directs a respective electron beam 28 (as shown for the case of electron tube beam 26a) onto the surface of a semiconductor substrate, or wafer, 24 also disposed within closed housing 22. Each of the electron beams 28 traces out an integrated circuit arrangement on the surface of the semiconductor substrate 24. The integrated circuits are formed by the electron beams 28 when the vacuum station is located in the secondary clean room 40 and not in the ultra clean room 44. The integrated circuits traced out by each of the electron beams 28 may be either of the same circuit design or of different portions of a larger integrated circuit. In the former case, the semiconductor substrate 24 would be divided into smaller substrate sections each containing one of the thus formed integrated circuits for use as separate integrated circuit boards. The electrical circuitry connected to each of the electron beam tubes is conventional in design and operation and is thus omitted from the figure. In addition, each of the electron beam tubes is typically operated under the control of a computer in forming an integrated circuit on the surface of the semiconductor substrate 24. The computer controller is also not shown in the figure for simplicity as such computer control systems are well known to those skilled in the relevant arts. Each of the electron beams is deflected in a conventional manner so as to be displaced over a portion of the surface of the semiconductor substrate 24 in forming an integrated circuit thereon. When the vacuum station enters the ultra clean room 44, the substrates having the just-formed integrated circuits are removed from the vacuum station and are replaced with a new set of substrates upon which integrated circuits are to be formed.

Figure 4:
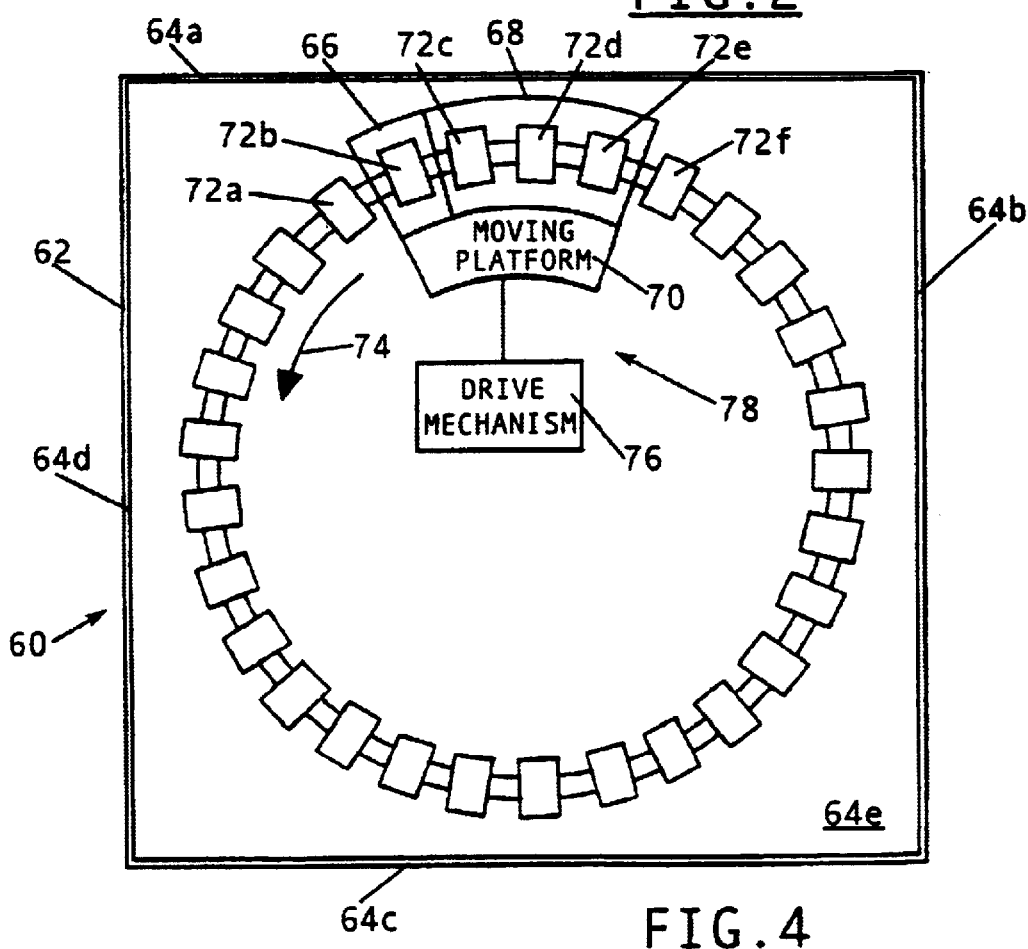
FIG. 4 is a simplified illustration of another embodiment of a clean room arrangement for use in the manufacture of semiconductor devices by means of electron beam lithography in accordance with the present invention.

Referring to FIG. 4, there is shown a simplified illustration of another embodiment of a clean room arrangement 60 in accordance with the principles of the present invention. In the embodiment shown in FIG. 4, the clean room arrangement 60 also includes a secondary clean room 62 containing an ultra clean room 68. One end of the ultra clean room 68 includes an air shower 66. In the embodiment shown in FIG. 4, the ultra clean room 68 is coupled to a transport system 78 for displacing the ultra clean room in the direction of arrow 74. Secondary clean room 62 is formed by first through fourth walls 64a–64d as well as a floor 65e and a ceiling (which is not shown in the figure for simplicity). As in the previously described embodiment, the secondary clean room 62 is preferably a Class 100 or Class 1000 clean room having on the order of 100 or 1000 contaminant particles per cubic foot of volume, respectively, while the ultra clean room 68 is preferably a Class 1 or Class 10 clean room having on the order of 1 to 10 contaminant particles per cubic foot of volume, respectively. The transport system 78 connected to the ultra clean room 68 may be any conventional means for displacing the ultra clean room 68 in the direction of arrow 74. Thus, the transport system 78 may be in the form of an overhead support mechanism supported by electrically powered rails or a moving support platform 70 upon which the ultra clean room is positioned having wheels and a drive mechanism 76 such as an electric motor.

Also disposed in a spaced manner within the secondary clean room 62 are plural vacuum stations, some of which are identified as elements 72a–72f. Each of the vacuum stations disposed in the secondary clean room 62 of FIG. 4 is similar in configuration and operation to the vacuum station 20 shown in FIG. 3 and described above. As the ultra clean room 68 is displaced by the transport system 70 in the direction of arrow 74, each of the vacuum stations is sequentially positioned within the moving ultra clean room. Thus, the vacuum stations 72c, 72d and 72e are shown as disposed within the moving ultra clean room 68. Vacuum station 72b is positioned within the air shower 66 for the removal of contaminant particles from the vacuum station as previously described. As in the previously described embodiment, integrated circuits are formed on substrates disposed within a vacuum station when the vacuum station is disposed in the secondary clean room 62. Once in the ultra clean room 68, the substrates having integrated circuits formed thereon are removed from the vacuum station and are replaced with a new set of clean substrates for forming integrated circuits thereon when in the secondary clean room 62. Also as in the previously described embodiment, ultra clean room 68 is maintained under a positive pressure so as to prevent contaminant particles from entering the ultra clean room from the secondary clean room 62. By displacing the ultra room 68 in a manner so as to sequentially position each of the vacuum stations within the ultra clean room for integrated circuit fabrication, the size and the cost of the ultra clean room, as well as cost of the integrated circuit manufacturing process, is substantially reduced. Although the embodiment shown in FIG. 4 shows the vacuum stations position in a generally circular array, this embodiment of the invention is not limited to this arrangement of the vacuum stations and contemplates transporting the ultra clean room 68 over virtually any aligned array of vacuum stations in manufacturing the integrated circuits.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawing is offered by way of illustration only and not as a limitation. The actual scope of the invention is intended to be defined in the following claims when viewed in their proper perspective based on the prior art.

I claim:

1. An arrangement for forming integrated circuits on a semiconductor substrate comprising:
   a first clean room characterized as containing a first reduced level of contaminants;
   plural vacuum stations arranged in a spaced manner in common alignment;
   a semiconductor substrate disposed at each vacuum station;
   plural electron beam sources disposed at each vacuum station and aligned with said semiconductor substrate for directing electron beams onto an associated semiconductor substrate for forming integrated circuits thereon;
   transport means connected to said first clean room or to said plural vacuum stations for sequentially positioning each vacuum station in said first clean room to permit substrates having integrated circuits formed thereon when the vacuum station is not in said first clean room to be removed from the vacuum station when in the first clean room and be replaced by another substrate; and
   a second clean room characterized as containing a second reduced level of contaminants, wherein said second reduced level of contaminants is greater than said first reduced level of contaminants and wherein said first clean room and said plural vacuum stations are disposed in said second clean room, and wherein said integrated circuits are formed on a substrate in a vacuum station when the vacuum station is in said second clean room.

2. The arrangement of claim 1 wherein said transport means is connected to said plural vacuum stations for sequentially moving each of said vacuum stations through said first clean room.

3. The arrangement of claim 2 wherein said transport means is a conveyor for supporting and sequentially moving each of said vacuum stations through said first clean room.

4. The arrangement of claim 3 further comprising a drive mechanism coupled to and displacing said conveyor.

5. The arrangement of claim 2 wherein said first clean room is a Class 1 or Class 10 clean room containing on the order of 1 or 10 contaminant particles per cubic foot of volume, respectively.

6. The arrangement of claim 5 wherein said second clean room is a Class 100 or Class 1000 clean room containing on the order of 100 or 1000 contaminant particles per cubic foot of volume, respectively.

7. The arrangement of claim 2 wherein said transport means is connected to said first clean room for displacing said first clean room along said plural vacuum stations for sequentially positioning each of the vacuum stations within said first clean room whereupon electron beams form integrated circuits on the semiconductor substrate positioned within the vacuum station disposed in the first clean room.

8. The arrangement of claim 7 wherein said transport means includes a moving platform coupled to and supporting said first clean room.

9. The arrangement of claim 8 wherein said transport means further includes a drive mechanism coupled to said moving platform.

10. The arrangement of said claim 7 wherein said first clean room is a Class 1 or 10 clean room containing on the order of 1 or 10 contaminant particles per cubic foot of volume, respectively.

11. The arrangement of claim 10 wherein said second clean room is a Class 100 or Class 1000 clean room containing on the order of 100 or 1000 contaminant particles per cubic foot of volume, respectively.

* * * * *